United States Patent [19]
Brunt et al.

[11] Patent Number: 5,694,060
[45] Date of Patent: *Dec. 2, 1997

[54] CMOS DIFFERENTIAL TWISTED-PAIR DRIVER

[75] Inventors: Roger Van Brunt, San Francisco; Florin Oprescu, Sunnyvale, both of Calif.

[73] Assignee: Apple Computer, Inc., Cupertino, Calif.

[*] Notice: The term of this patent shall not extend beyond the expiration date of Pat. No. 5,418,478.

[21] Appl. No.: 355,428

[22] Filed: Dec. 13, 1994

Related U.S. Application Data

[63] Continuation of Ser. No. 100,662, Jul. 30, 1993, Pat. No. 5,418,478.
[51] Int. Cl.[6] .................................... H03F 19/0175
[52] U.S. Cl. ..................................... 326/86; 326/58
[58] Field of Search .......................... 326/86, 90, 85, 326/30, 58, 109, 112; 327/109, 112

[56] References Cited

U.S. PATENT DOCUMENTS

| | | | |
|---|---|---|---|
| 4,825,099 | 4/1989 | Barton | 326/86 |
| 4,890,010 | 12/1989 | Neudeck | 326/86 |
| 5,066,873 | 11/1991 | Chan | 326/86 |
| 5,105,107 | 4/1992 | Wilcox | 307/475 |
| 5,122,690 | 6/1992 | Bianchi | 307/475 |
| 5,162,672 | 11/1992 | McMahan | 326/86 |
| 5,254,883 | 10/1993 | Horowitz | 326/86 |
| 5,287,022 | 2/1994 | Wilsher | 307/542 |
| 5,313,118 | 5/1994 | Lundberg | 307/451 |
| 5,404,051 | 4/1995 | Kobayashi | 327/112 |

OTHER PUBLICATIONS

Shen et al.; "Applied Electromagnetism"; copyright 1987 (no month available) by PWS Publishers; pp. 141–144 and 156–158.

Primary Examiner—Edward P. Westin
Assistant Examiner—Benjamin D. Driscoll
Attorney, Agent, or Firm—Blakely, Sokoloff, Taylor & Zafman

[57] ABSTRACT

A CMOS differential twisted-pair driver which utilizes CMOS switches and current sources advantageously. No alternative power supply is required, the switches do not have to be low impedance and the device is low power. The preferred embodiment driver further limits signal overshoot and common mode energy. The signal transmission facility is bi-directional so an off state is provided. It is doubly terminated to provide for symmetry, improved bandwidth and reduces reflective signal noise. The double termination also provides for faster rise and fall times which reduces the systems sensitivity to receiver offset.

6 Claims, 7 Drawing Sheets

CMOS DIFFERENTIAL TWISTED-PAIR DRIVER

RELATED APPLICATION

This is a continuation of U.S. application Ser. No. 08/100,662 now U.S. Pat. No. 5,418,478, filed Jul. 30, 1993, and assigned to the assignee of the present invention.

BACKGROUND OF THE INVENTION

1. Field of the Invention

The present invention relates to the field of data communications. More particularly, the present invention relates to the efficient transmission of information over high speed data communicating links.

2. Description of Related Art

It is well-known in the data communications field that for the transmission of high bit rate data signals small differential signals provide a number of advantages. A differential channel provides rejection of common mode noise present between a transmitting and receiving node such as power supply noise. Differential signals can be transmitted on twisted-pair cables which are less expensive than coaxial or fiber optic cables and which when shielded offer very good rejection of interference from external noise sources. Using small signal level differential signals on a shielded twisted-pair cable reduces EMI emissions, simplifies transmitter design and reduces power dissipation.

One of the most important characteristics of a differential communication channel is that it reduces timing distortion due to mismatched rise and fall times and receiver threshold. Timing distortion must be minimized since in a digital communication system data is encoded in both time and amplitude. FIG. 1(a) illustrates a single-ended system with mismatched rise and fall times and a threshold VT. As can be seen the mismatch in rise and fall times causes duty cycle distortion (Tpulse does not equal $T_{bc}$ where $T_{bc}$ is the bit cell width and Tpulse is the received pulse width.) It is very difficult in a single-ended communication system to match the rise and fall times and this mismatch becomes significant when data rates become high (50 Mbaud or more).

Differential systems on the other hand do not suffer duty cycle distortion due to rise and fall time mismatch. As shown in FIG. 1(b), as long as signal A and B have equivalent rise times and equivalent fall times the signal's pulse width is preserved. This type of matching is much more simple to guarantee in an integrated circuit design that has a symmetric layout for the A and B signals. It is also important to note that in a differential receiver the threshold is not set externally as in the single-ended system which was set by the VT reference shown in FIG. 1(a). Instead, the threshold in a differential system is a function of the received signal and therefore tracks with the received signal corresponding to when A=B (the signal crossing point).

In developing a differential signal transmission driver for use by CMOS logic circuits, there are a number of constraints to contend with. For example, a voltage driver such as that shown in FIG. 2 used to drive a differential signal on the twisted-pair cable requires an output impedance much less than Zo in order to provide good termination and signal amplitude control. For a typical shielded twisted pair Zo equals approximately 110 ohms. In CMOS to achieve low output impedance requires large devices and large currents, typically four to seven times that required for bipolar transistors. For example, to achieve 10 ohms would typically require 40 ma. FIG. 3 illustrates an alternative CMOS voltage driver to the one shown in FIG. 2. In this alternative, the circuit takes advantage of the fact that CMOS technology provides for good switches. However, this approach requires a separate low voltage power supply in order to provide a small output signal. A 1 volt output signal amplitude requires a supply voltage V' of 2 volts. A 2 volt supply though provides a small overdrive voltage ($V_{gs}-V_t=1$ volt) for the CMOS switches. This makes the CMOS switches very large (since the switch resistance must be less than Zo) yielding slow switches. This driver also requires a large drive current of V'/(2Zo)=9 ma.

SUMMARY OF THE INVENTION

In light of the foregoing it can be appreciated that there is a need for a method and apparatus for the efficient transmission of data over a differential communications link from a system operating with large amplitude single-ended signals. It is therefore an object of the present invention to provide a method and apparatus for converting and driving single-ended CMOS level signals as small amplitude fully differential signals over a differential communications link.

It is also an object of the present invention to provide a signal transmission driver for a CMOS circuit which takes advantage of the fact that CMOS switches and current sources perform well.

It is another object of the present invention to provide a signal driver suitable for driving signal transmissions over a twisted-pair cable which is low power and lends itself to low voltage CMOS technology.

It is also an object of the present invention to provide a signal transmission driver having a large common mode range, high differential and common mode impedance, and a high impedance off state. The high impedance and the off state allow other drivers (transceivers) to be connected to the transmission system as in a bus or bi-directional point-to-point interconnect.

These and other objects of the present invention are provided by a CMOS differential twisted-pair driver which utilizes CMOS switches and current sources advantageously. No alternative power supply is required, the switches do not have to be low impedance, the device is low power and the driver inputs are just digital CMOS signals. The preferred embodiment driver further limits signal overshoot and common mode energy. The signal transmission facility may be a bus or bi-directional point-to-point interconnect. The signaling may be 3-level taking advantage of the driver's high, low and off states. The transmission facility may also allow for collisions between multiple drivers driving at the same time since the drivers are high impedance current sources as opposed to voltage sources. It is doubly terminated to provide for symmetry, improved bandwidth and reduced reflective signal noise. The double termination also provides for faster signal rise and fall times which reduces the system's sensitivity to receiver offset.

BRIEF DESCRIPTION OF THE DRAWINGS

The objects, features and advantages of the present invention will be apparent from the following detailed description in which.

DETAILED DESCRIPTION OF THE INVENTION

A method and apparatus are described for the conversion and transmission of CMOS level logic signals as small amplitude fully differential transmission signals. In the following description, many specific details are set forth such as particular voltage and current levels, etc., in order to provide a thorough description of the present invention. It will be apparent, however, to one of ordinary skill in the art that the present invention may be prepared without such specific details. In other instances, well-known structures and techniques have not been described in detail in order not to obscure unnecessarily the present invention.

Figure 4:
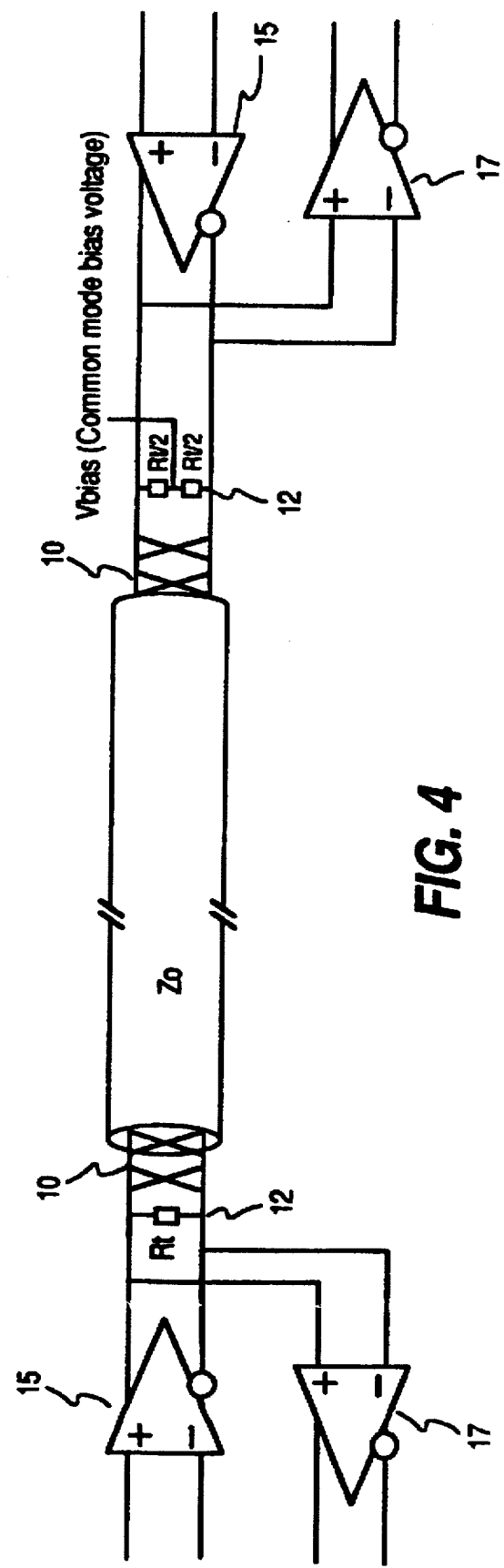
FIG. 4 illustrates a block diagram of a bi-directional point-to-point implementation of a signal communication system in accordance with the present invention.

The foregoing sections illustrate the desirability of implementing a differential communication channel for the transmission of high bit-rate serial data. As was also described, to implement a differential signal driver using CMOS technologies requires dealing with a number of constraints. Before describing in detail the signal driver of the present invention it is useful to look at the overall system in which it will be implemented. FIG. 4 illustrates schematically a communication channel between two nodes coupled by a twisted-pair cable 10. The implementation shown is the bi-directional point-to-point implementation of the present invention. A bus implementation is an obvious extension of the principle. The channel is exhibited as displaying an impedance Zo, typically 110 ohms for shielded twisted-pair systems. Each end of the communication link is provided with a signal transmitter 15, signal receiver 17 and terminating resistance 12 ($R_T$=Zo). At one end the common mode voltage bias is provided. The signal transceiver circuitry is designed to be implemented on all nodes communicating on a given serial communication network or bus.

There are a number of requirements for implementing the preferred embodiment communication driver. The transceiver may be bi-directional or implemented for a bus so the transmitter must be high impedance and provide an off state. The use of terminating resistance at both sides of the channel facilitates a symmetrical arrangement. It also provides for increased bandwidth because load capacitances will encounter impedance of Zo/2 instead of Zo. Double termination also reduces the reflective signal noise and provides for faster signal rise and fall times thus reducing the sensitivity to receiver offset. Other requirements for the signal driver are that it must propagate small signals in order to reduce power requirements and to reduce EMI emissions. Finally, the driver of the preferred embodiment of the present invention is to be implemented in a CMOS technology.

Figure 1A:
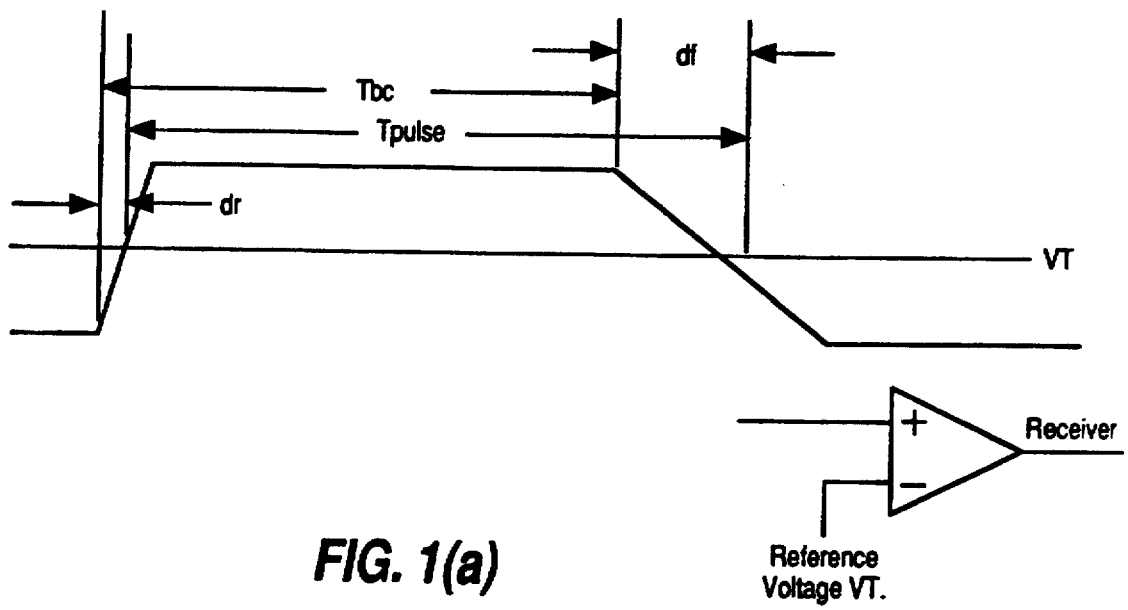
FIGS. 1(a) and 1(b) illustrate graphically single-ended signal and a differential binary signal showing duty-cycle distortion characteristics of both.
Figure 1B:
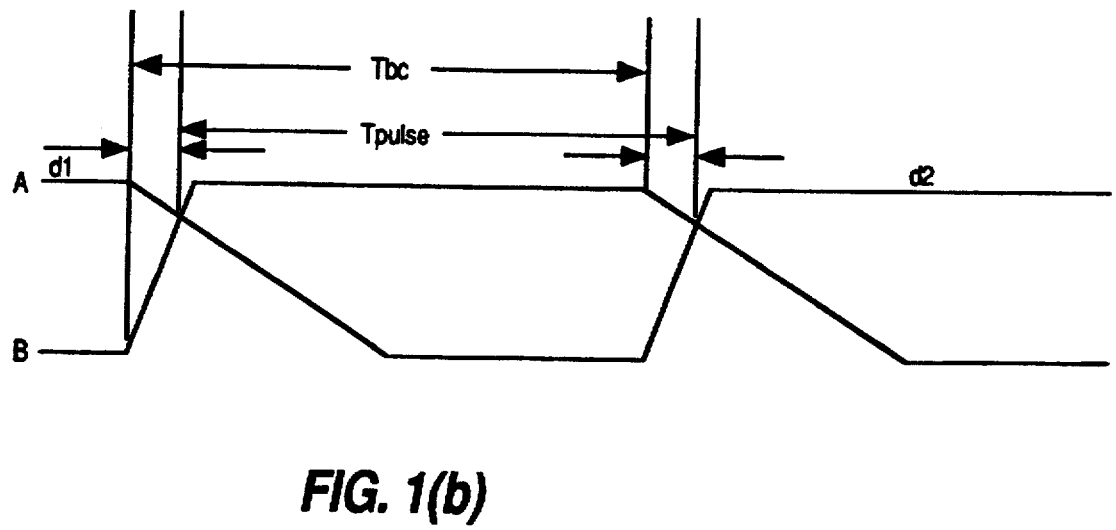
Figure 2:
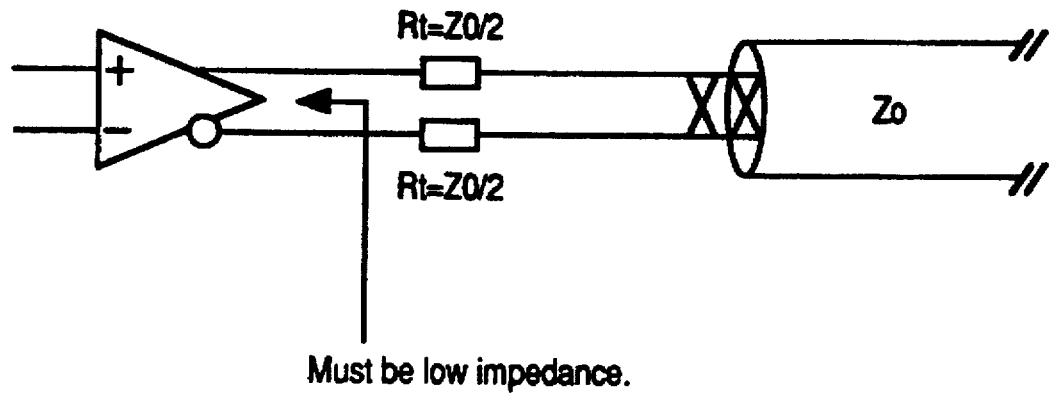
FIG. 2 shows a diagram of a simple voltage driver for driving differential signals on a twisted-pair communication link.
Figure 3:
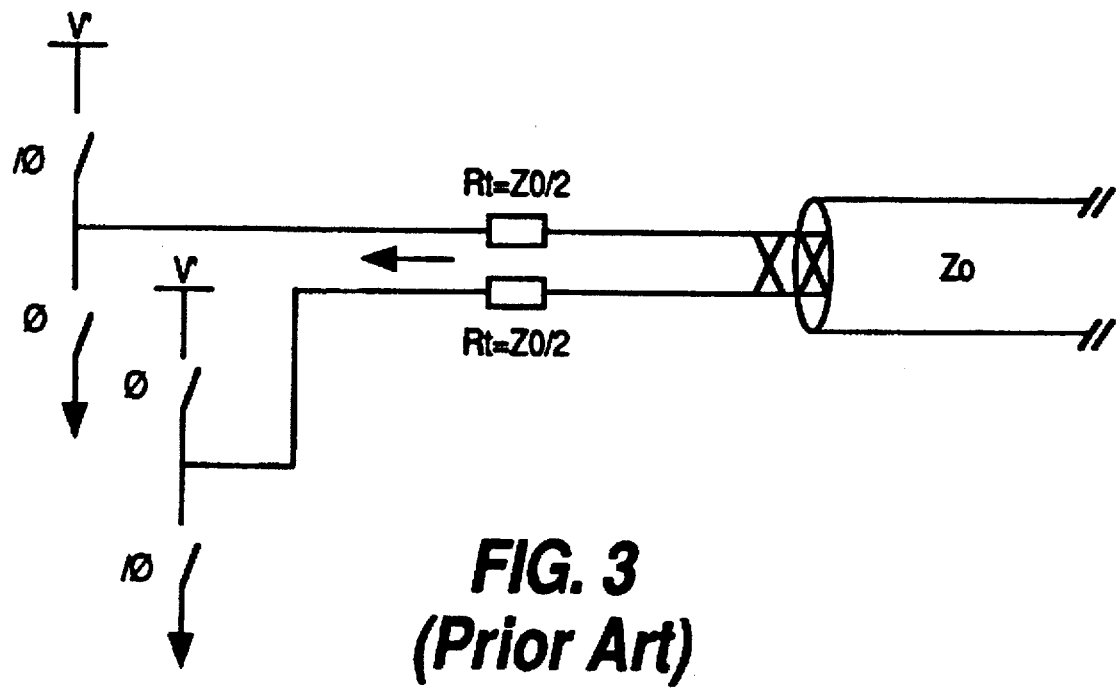
FIG. 3 illustrates an alternative embodiment voltage driver improved over the one of FIG. 2 but still suffering disadvantages regarding differential signals over a communications link.

FIG. 2 and 3 each illustrate alternative embodiment voltage drivers for driving differential signals on a twisted-pair cable. Each suffers a number of disadvantages described in the preceding section. The embodiment of FIG. 3 does have advantages over the embodiment of FIG. 2 in that it utilizes CMOS switches advantageously. A disadvantage to the embodiment of FIG. 3 is that it requires a separate low voltage power supply for driving signals which only allows for a very small overdrive voltage for the CMOS switches. Other drawbacks are recited in a preceding section.

Figure 5:
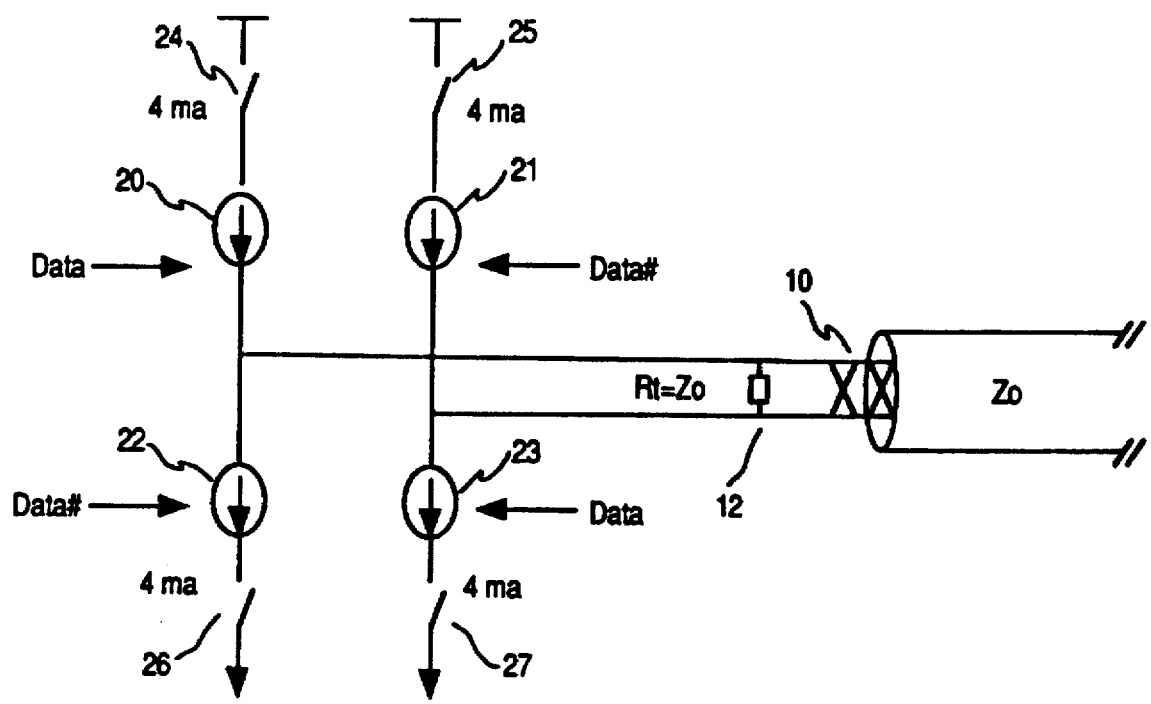
FIG. 5 is a symbolic drawing of the components of a differential twisted-pair driver in accordance with one embodiment of the present invention.

Referring now to FIG. 5, a symbolic diagram of the twisted-pair driver in accordance with a preferred embodiment of the present invention is shown. The driver is coupled to twisted-pair cable 10 across terminating resistor 12. The driver circuit includes four current sources 20, 21, 22 and 23. In the preferred embodiment each is a 4 ma current source with sources 20 and 21 coupled on the Vcc side and sources 22 and 23 on the ground side. The circuit also comprises four CMOS switches 24, 25, 26 and 27. Each current source is coupled between a respective switch and the twisted-pair cable. In an alternative embodiment the current source and switches may be juxtaposed, but it has been found that the preferred embodiment arrangement minimizes signal overshoot.

Figure 6A:
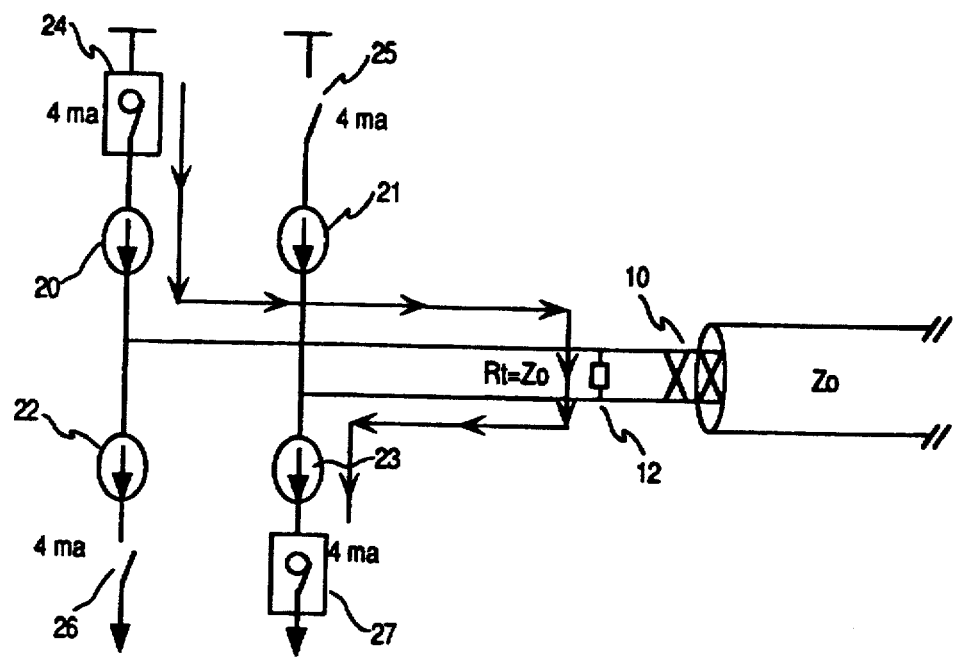
FIGS. 6(a) and 6(b) illustrate the operation of the present invention signal driver.
Figure 6B:
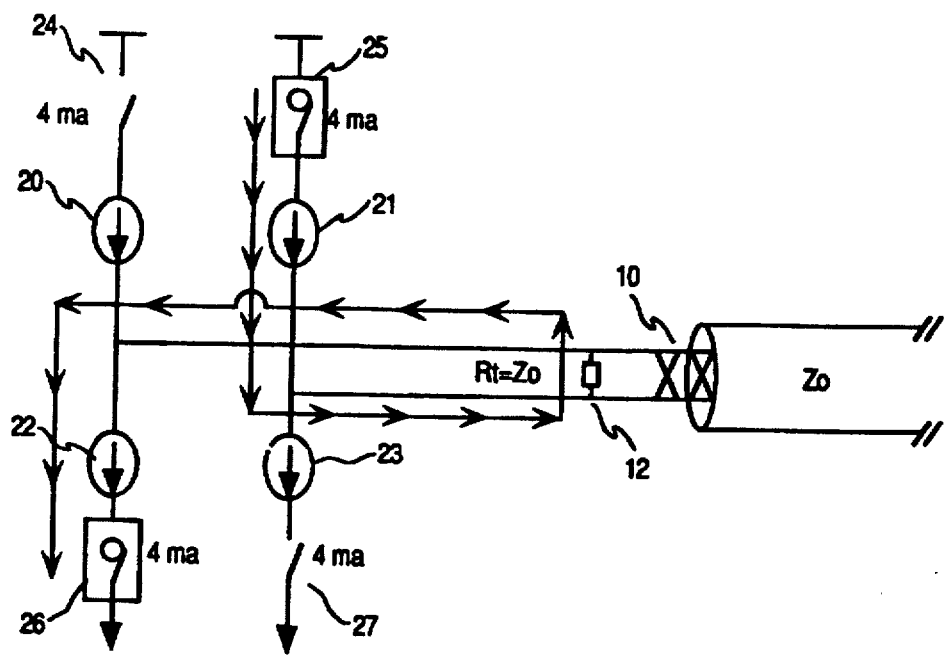

Referring now to FIGS. 6(a) and 6(b) the operation of the preferred embodiment twisted-pair driver is as follows. FIG. 6(a) shows the configuration for signaling a high signal in which switches 24 and 27 are closed while switches 25 and 26 remain open. The current flows through terminating resistor 12 and the twisted-pair cable along the path indicated. A current of 4 ma would generate +220 mv for a cable having Zo=110 ohms. This is the state responsive to a CMOS high input data signal. FIG. 6(b) shows the configuration for signaling a "low" signal, in which switches 25 and 26 are closed while switches 24 and 27 remain open. The current flows through terminating resistor 12 and the twisted-pair cable along the path indicated generating −220 mv's. This is the state responsive to a CMOS low input data signal.

The preferred embodiment transmitter actually provides for a 3 states permitting 3-level encoding. The +4 mA state occurs as described above when switches 24 and 27 only are closed. The −4 mA state occurs when switches 25 and 26 only are closed. These two states are used for data packet transmission. The configuration of the present invention also provides for a third detectable state, the 0 mA state. This occurs when all four switches are held open or when the current sources are turned off. In the preferred embodiment there is no power dissipation and the circuit provides high impedance. Such a state need not be used for packet transmission but may be useful for other purposes such as for arbitration.

Figure 7:
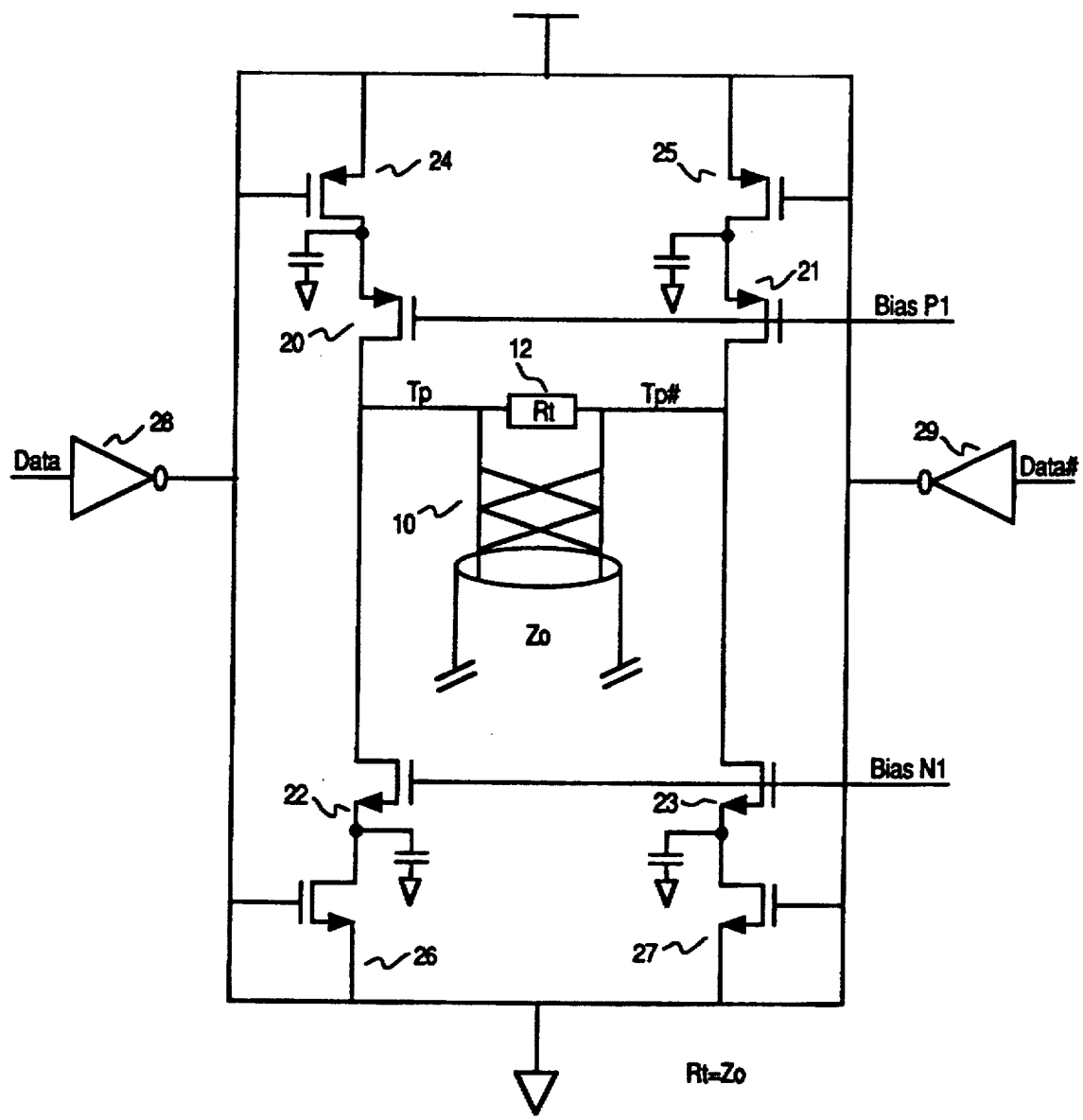
FIG. 7 illustrates a circuit level diagram of the preferred embodiment twisted-pair signal driver of the present invention.

Referring now to FIG. 7, a detailed circuit diagram of the preferred embodiment twisted-pair driver is shown. In this figure switches 24, 25, 26 and 27 are shown as transistors coupled to the current source transistors 20, 21, 22 and 23, respectively. Parasitic capacitors are illustrated between each respective switch and current source pair. The CMOS level digital signals are supplied to the driver through inverters 28 and 29. As was noted above this arrangement of current sources and switches (current sources on top of the switches and switches at the rails) is preferred because it reduces signal overshoot. The alternative arrangement of switches and current sources suffers a greater signal overshoot problem due to parasitic capacitances between adjacent switches and current sources.

Figure 8A:
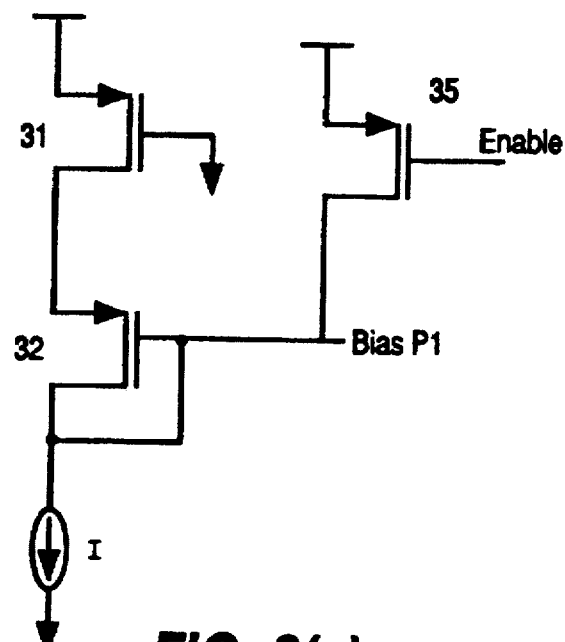
FIGS. 8(a) and 8(b) illustrate biasing circuits for the preferred embodiment twisted-pair signal drive of the present invention.
Figure 8B:
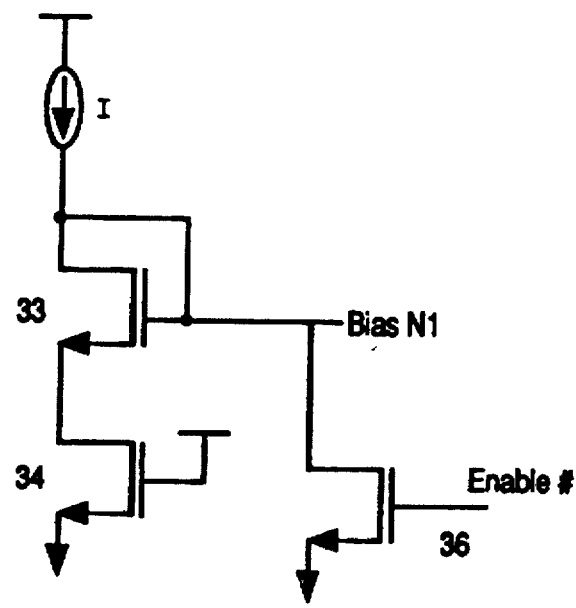

As can be seen in FIG. 7 current source transistors 20 and 21 receive a biasing voltage P1 at their gates while current source transistors 22 and 23 receive biasing voltage N1. FIG. 8(a) illustrates the source of biasing voltage P1 and FIG. 8(b) illustrates the circuitry for generating biasing voltage N1. The gate of transistor 32 and the drain of transistor 35 of FIG. 8(a) are coupled to the gates of transistors 20 and 21 of FIG. 7. The gate of transistor 33 and the drain of transistor 36 of FIG. 8(b) are coupled to the gates of transistors 22 and 23 of FIG. 7. This biasing forces the current in current source 20 (or 21) to be proportional to I when the gate of transistor 24 (or 25) is low. The current in current source 22 (or 23) is forced to be proportional to I when the gate of transistor 26 (or 27) is high. An Enable signal is indicated for activating the driver. When the Enable signal is high the currents flow through transistors 31, 32 and 33,34 and are mirrored out to the driver. When the Enable signal is low the currents are shunted through transistors 35 and 36 turning off the currents in the driver.

Although the present invention has been described in terms of preferred embodiments, it will be appreciated that various modifications and alterations might be made by those skilled in the art without departing from the spirit and scope of the invention. The invention should, therefore, be measured in terms of the claims which follow.

We claim:

1. A CMOS twisted-pair signal driver responsive to CMOS level signals for coupling to a twisted-pair communication cable for signaling information, said signal driver comprising:

first signal current driving circuitry responsive to a first CMOS level signal logic state for propagating a first signal state over a twisted-pair cable, said first signal current driving circuitry including a terminating resistor through which a first current flows when said first signal state is propagating over said twisted pair cable; and second signal current driving circuitry responsive to a second CMOS level signal logic state for propagating a second signal state over said twistedpair cable, said second current driving circuitry including the terminating resistor through which a second current flows when said second signal state is propagating over said twisted pair cable;

wherein said first and second signal states have approximately equal amplitudes with opposite sign.

2. The signal driver of claim 1 wherein a third signal state comprises one having approximately a zero amplitude.

3. A signal driver responsive to digital logic level signals for coupling to a communications medium for signaling information, said signal driver comprising:

a first signal current driver responsive to a first digital logic level signal state for propagating a first signal state over said communications medium, said first signal current driving circuitry including a terminating resistor through which a first current flows when said first signal state is propagating over said communications medium; and a second signal current driver responsive to a second digital logic level signal state for propagating a second signal state over a communications medium, said second current driving circuitry including the terminating resistor through which a second current flows when said second signal state is propagating over said communications medium;

wherein said first and second signal states have approximately equal amplitudes with opposite sign.

4. The signal driver of claim 3 wherein a third signal state comprises one having approximately zero amplitude.

5. The signal driver of claim 3 wherein said digital logic level signals correspond to CMOS level signal states.

6. The signal driver of claim 3 wherein said communications medium comprises a twisted pair communications cable.

* * * * *